United States Patent
Fischer (10) Patent No.: US 11,201,236 B2
(45) Date of Patent: Dec. 14, 2021

(54) SEMICONDUCTOR DEVICE

(71) Applicant: Infineon Technologies Austria AG, Villach (AT)

(72) Inventor: Bjoern Fischer, Munich (DE)

(73) Assignee: Infineon Technologies Austria AG, Villach (AT)

( * ) Notice: Subject to any disclaimer, the term of this patent is extended or adjusted under 35 U.S.C. 154(b) by 92 days.

(21) Appl. No.: 16/778,092

(22) Filed: Jan. 31, 2020

(65) Prior Publication Data

US 2020/0251587 A1    Aug. 6, 2020

(30) Foreign Application Priority Data

Feb. 4, 2019 (EP) .................................... 19155232

(51) Int. Cl.
*H01L 29/78* (2006.01)
*H01L 29/06* (2006.01)
*H01L 29/66* (2006.01)

(52) U.S. Cl.
CPC ...... *H01L 29/7802* (2013.01); *H01L 29/0619* (2013.01); *H01L 29/66712* (2013.01)

(58) Field of Classification Search
CPC .............................. H01L 29/0619–0623; H01L 29/66712–66734; H01L 29/7802–7815
See application file for complete search history.

(56) References Cited

U.S. PATENT DOCUMENTS

| 2015/0041965 | A1 | 2/2015 | Schulze et al. |
| 2015/0054119 | A1 | 2/2015 | Tan et al. |
| 2015/0333169 | A1* | 11/2015 | Willmeroth ......... H01L 29/7802 257/329 |

FOREIGN PATENT DOCUMENTS

WO    2018034250 A1    2/2018

* cited by examiner

*Primary Examiner* — Daniel P Shook
(74) *Attorney, Agent, or Firm* — Murphy, Bilak & Homiller, PLLC (57) ABSTRACT

A semiconductor device includes a semiconductor body having opposing first and second surfaces in a vertical direction, a first semiconductor region of a first doping type electrically coupled to a first terminal, a second semiconductor region of a second doping type electrically coupled to a second terminal, and a third semiconductor region of the second doping type, but less highly doped than the second semiconductor region, extending in an active region of the semiconductor device from the first to the second semiconductor region in the vertical direction. A horizontal field-stop-region of the first doping type extends in an edge region of the device from the first semiconductor region into the semiconductor body in the vertical direction, such that it directly adjoins the first and second semiconductor regions. A horizontal compensation region of the first doping type extends from the horizontal field-stop-region into the second semiconductor region in a horizontal direction.

19 Claims, 5 Drawing Sheets

SEMICONDUCTOR DEVICE

TECHNICAL FIELD

The instant disclosure relates to a semiconductor device, in particular to a semiconductor device with a large lateral blocking voltage.

BACKGROUND

Semiconductor devices such as insulated gate power transistor devices, e.g., power MOSFETs (Metal Oxide Semiconductor Field-Effect Transistors), are widely used as electronic switches in various types of electronic applications. In the off-state, such semiconductor devices are required to block a reverse voltage in a vertical direction of the semiconductor device. This requires device regions, over which this reverse voltage drops horizontally. However, such device regions often have a resistance that is not low enough to block the entire voltage.

It is desirable to provide a robust semiconductor device that provides a large lateral blocking voltage.

SUMMARY

One example relates to a semiconductor device. The semiconductor device includes a semiconductor body comprising a first surface and a second surface opposite to the first surface in a vertical direction, a first semiconductor region of a first doping type that is electrically coupled to a first terminal, a second semiconductor region of a second doping type that is electrically coupled to a second terminal, and a third semiconductor region of the second doping type but less highly doped than the second semiconductor region that extends in an active region of the semiconductor device from the first semiconductor region to the second semiconductor region in the vertical direction. A horizontal field-stop-region of the first doping type extends in an edge region of the semiconductor device from the first semiconductor region into the semiconductor body in the vertical direction such that it directly adjoins the first semiconductor region and the second semiconductor region. A horizontal compensation region of the first doping type extends from the horizontal field-stop-region into the second semiconductor region in a horizontal direction, wherein the horizontal direction is perpendicular to the vertical direction.

One example relates to a method. The method includes forming a second semiconductor region in a first layer of semiconductor material by implanting ions of a second doping type, forming a second section of a horizontal field-stop-region in the first layer of semiconductor material by implanting ions of a first doping type, wherein the second section of the horizontal field-stop-region adjoins the second semiconductor region in a horizontal direction, forming a horizontal compensation region in the second semiconductor region, by implanting ions of the first doping type, wherein the horizontal compensation region extends from the second section of the horizontal field-stop-region into the second semiconductor region in the horizontal direction, depositing a second layer of semiconductor material on the first layer of semiconductor material, forming a third semiconductor region of the second doping type in the second layer of semiconductor material, forming a first semiconductor region of the first doping type in the second layer of semiconductor material, wherein the third semiconductor region is arranged between the first semiconductor region and the second semiconductor region in a vertical direction that is perpendicular to the horizontal direction, and forming a first section of the horizontal field-stop-region of the first doping type, wherein the first section extends from the first semiconductor region to the second section in the vertical direction.

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
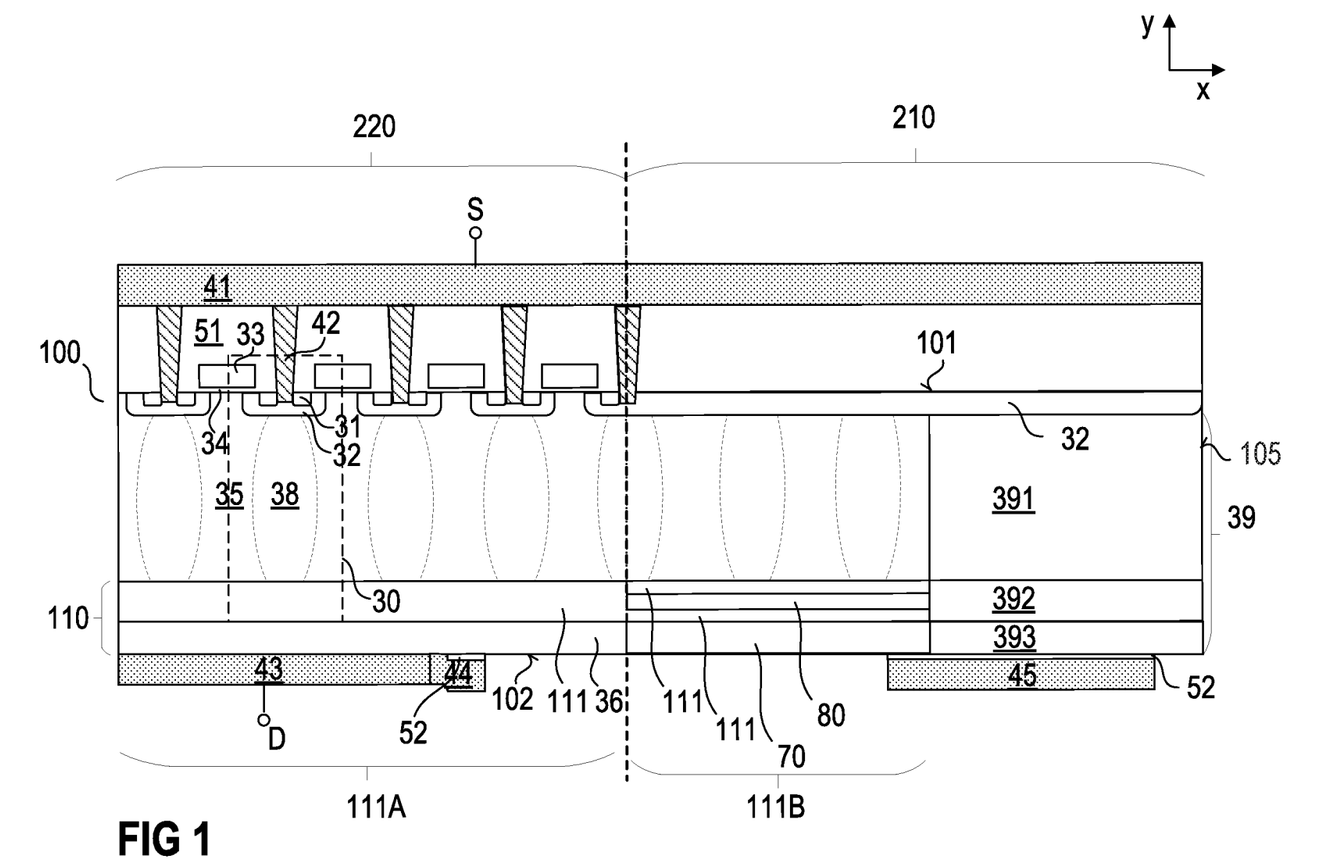
FIG. 1 schematically illustrates a cross sectional view of a semiconductor device.

Referring to FIG. 1, a cross-sectional view of a semiconductor device comprising a semiconductor body 100 is schematically illustrated. The semiconductor body 100 may include a conventional semiconductor material such as, for example, silicon (Si), silicon carbide (SiC), gallium nitride (GaN), gallium arsenide (GaAs), or the like. A transistor device is formed in the semiconductor body 100, the transistor device being arranged in an active region 220 of the semiconductor body 100. In FIG. 1, only a small section of the transistor device is shown. In its active region 220, the semiconductor body 100 includes at least one working transistor cell 30 with a gate electrode 33 that is dielectrically insulated from a body region 32 by a gate dielectric 34. The body region 32 is a doped semiconductor region in the active region 220 of the semiconductor body 100. In the example illustrated in FIG. 1, the body region 32 extends from a first surface 101 into the semiconductor body 100, and the gate electrode 33 is arranged above the first surface 101 of the semiconductor body 100.

The transistor device illustrated in FIG. 1 further includes a drift region 35 formed in the semiconductor body 100. The drift region 35 adjoins the body region 32 of the at least one transistor cell 30 and forms a pn-junction with the body region 32. The drift region 35 is arranged between the body region 32 of the at least one transistor cell 30 and a semiconductor layer 110. The semiconductor layer 110 is arranged between a second surface 102 of the semiconductor body 100 and the drift region 35. The second surface 102 is arranged opposite to the first surface 101 in a vertical direction y of the semiconductor body 100.

The semiconductor layer 110 comprises a drain region 36 of the same doping type as the drift region 35 and adjoining the second surface 102. A vertical field-stop-region 111 of the same doping type as the drift region 35 and the drain region 36, but less highly doped than the drain region 36, may be arranged between the drift region 35 and the drain region 36. That is, the semiconductor layer 110 may be formed by the drain region 36 and the adjoining vertical field-stop-region 111, as is illustrated in FIG. 1. The vertical field-stop-region 111 may be formed by a single layer or by a plurality of separate sub-layers, e.g., at least two sub-layers. Sub-layers that are arranged closer to the drift region 35 may be less highly doped than sub-layers that are arranged further away from the drift region 35. For example, a doping concentration of a sub-layer that is arranged adjacent to the drift region 35 may be selected from a range of between 1E15 and 1E16 $cm^{-3}$ or lower. A doping concentration of a sub-layer that is arranged adjacent to the drain region 36 may be higher than a doping concentration of a sub-layer that is arranged horizontally above. The doping concentration of the sub-layer that is arranged adjacent to the drain region 36, however, may be lower than a doping concentration of the drain region 36. Generally speaking, a doping concentration of the different sub-layers may increase from the drift region 35 towards the drain region 36.

Still referring to FIG. 1, the transistor device includes at least one vertical compensation region 38 of a doping type complementary to the doping type of the drift region 35. According to one example, the transistor device includes a plurality of transistor cells 30 and each transistor cell 30 includes a vertical compensation region 38 adjoining the body region 32 of the respective transistor cell 30. In a vertical direction y of the semiconductor body 100, which is a direction perpendicular to the first surface 101 and to the second surface 102, the at least one vertical compensation region 38 extends from the body region 32 into the semiconductor body 100 towards the semiconductor layer 110.

Still referring to FIG. 1, the transistor device further includes a source electrode 41. The source electrode 41 is electrically connected to the source region 31 and the body region 32 of the at least one transistor cell 30 by means of contact plugs 42. The contact plugs 42 may comprise at least one of polysilicon, tungsten, aluminum, copper, and a Ti/TiN barrier liner, for example. This source electrode 41 forms a source node S or is electrically connected to a source node S of the transistor device. The transistor device further includes a drain node D electrically connected to the drain region 36. A drain electrode 43 electrically connected to the drain region 36 may form the drain node D.

Figure 2:
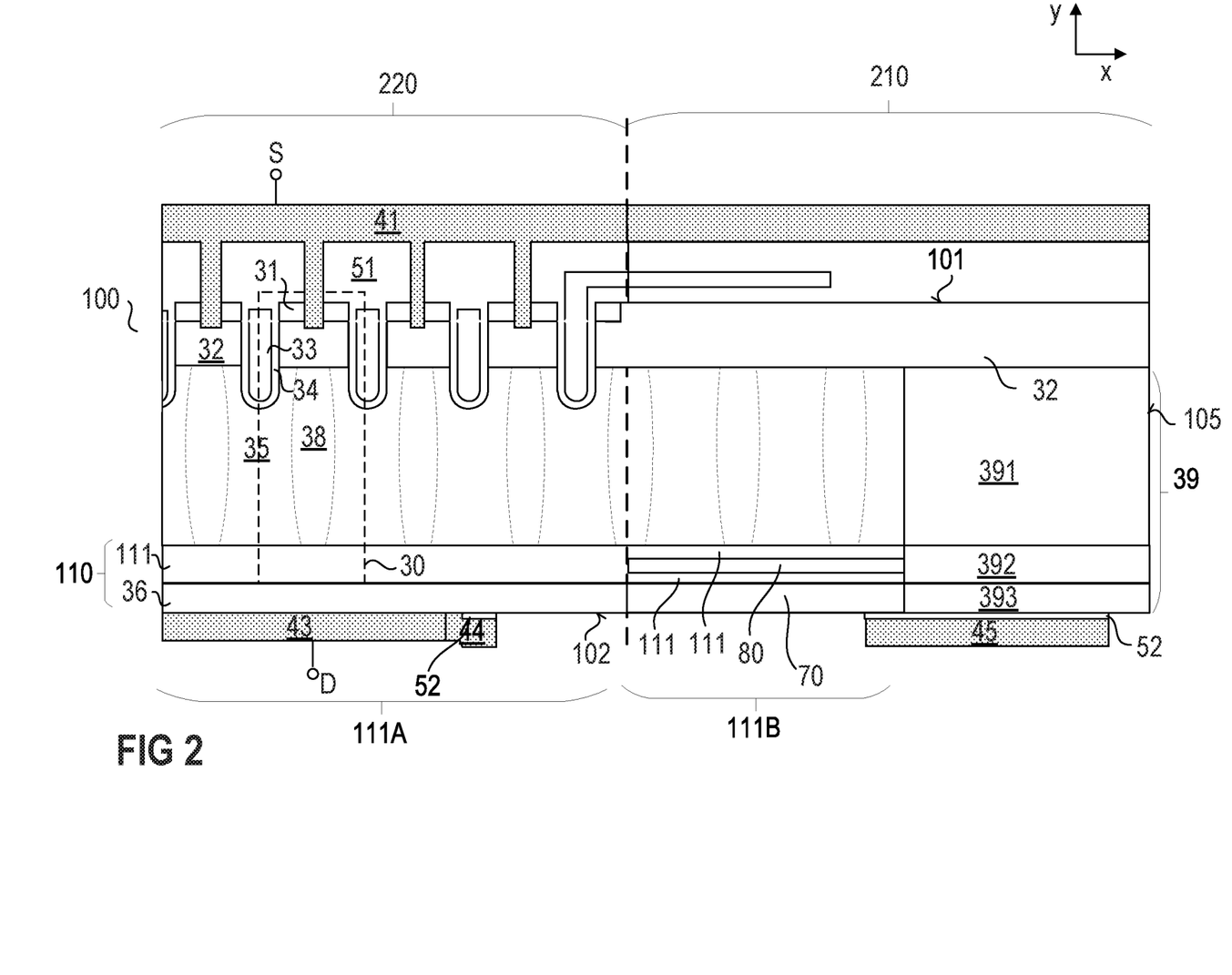
FIG. 2 schematically illustrates a cross sectional view of another semiconductor device.

The transistor device can be an n-type transistor device or a p-type transistor device. The device type is defined by the doping type of the source region 31. In an n-type transistor device, the source region 31 is an n-type region, the body region 32 is a p-type region, the drift region 35, which has a doping type complementary to the doping type of the body region 32, is an n-type region, and the at least one vertical compensation region 38 is a p-type region. In a p-type transistor device, the source region 31 is a p-type region, the body region 32 is an n-type region, the drift region 35 is a p-type region, and the at least one vertical compensation region 38 is an n-type region. The transistor device can be implemented as a MOSFET, for example. In a MOSFET, the drain region 36 has the same doping type as the drift region 35, as has been described above. For example, a doping concentration of the drain region 36 is selected from a range of between 1E18 and 1E19 $cm^{-3}$, 1E18 and 1E20 $cm^{-3}$, or 1E18 and 1E21 $cm^{-3}$, doping concentrations of the drift region 35 and the vertical compensation region 38 are selected from a range of between 1E15 and 5E16 $cm^{-3}$, and a doping concentration of the body region 32 is selected from between 5E16 $cm^{-3}$ and 5E17 $cm^{-3}$. The transistor cells 30 illustrated in the Figures are planar transistor cells. Implementing the transistor cells 30 as planar transistor cells, however, is only one example. According to another example, as is illustrated in FIG. 2, the transistor cells 30 are implemented as trench transistor cells. That is, the at least one gate electrode 33 is arranged in a trench that extends from the first surface 101 into the semiconductor body 100.

In the transistor device explained above, a plurality of transistor cells 30 is connected in parallel. That is, the source regions 31 of these transistor cells 30 are connected to the source node S, the common drain region 36 is connected to the drain node D, and the at least one gate electrode 33 is connected to a gate node.

The contact plugs 42 that are arranged below the source electrode 41 extend from the source and body regions 31, 32 through an insulation layer 51 that is formed on the top surface 101 of the semiconductor body 100 to the source electrode 41 to electrically couple the source and body regions 31, 32 to the source electrode 41. In FIGS. 1 and 2, the insulation layer 51 is illustrated as a single continuous layer which extends from the first surface 101 of the semiconductor body 100 to the source electrode 41. This, however, is only an example. Often, a gate oxide layer with a thickness of, e.g., 5 nm to 200 nm or 40 nm to 120 nm, is arranged on the first surface 101 of the semiconductor body 100. The insulation layer 51 may comprise this gate oxide layer and an additional layer which is formed on top of this gate oxide layer. This additional layer may comprise an undoped TEOS (tetraethyl orthosilicate) which may have a thickness of about 50 nm to 500 nm, and a doped BPSG (borophosphosilicate glass) having a thickness of about 200 nm to 200 nm or 1100 nm to 1300 nm, for example. The insulation layer 51, therefore, may comprise several sub-layers.

In conventional semiconductor devices comprising a transistor device, a gate pad that is electrically coupled to the gate electrodes 33 is arranged on the same side as the source electrode 41. Such devices may also be referred to as drain-down devices. The examples illustrated in FIGS. 1 and 2, however, schematically illustrate so-called source-down devices. The gate pad (not illustrated in FIGS. 1 and 2) is arranged on the same side as the drain electrode 43 in a source-down device. The gate pad is electrically connected to the gate electrodes 33. For example, the at least one gate electrode 33 may be electrically coupled to a so-called gate runner (not specifically illustrated) arranged in an edge region 210 of the semiconductor body 100. Such a gate runner may be arranged on the source side of the semiconductor body 100 (closer to the first surface 101 than to the second surface 102) and is electrically coupled to a gate pad by means of a contact plug or through hole (not specifically illustrated), for example. A contact plug may extend from the gate runner towards the gate pad in the edge region 210 of the semiconductor body 100. The edge region 210 will be described in further detail below. Such electrical connections between the gate electrodes 33 and a gate pad that is arranged on the same side as the drain electrode 43, however, are generally known and, therefore, are not specifically illustrated in FIGS. 1 and 2.

A semiconductor body 100 usually comprises not only an active region 220, but also an inactive region, also referred to as passive region or edge (termination) region 210. The semiconductor arrangement, that is, the plurality of transistor cells 30, may be implemented within the active region 220 of the semiconductor body 100. An edge region 210, e.g., may be a region adjacent to the horizontal edges (outer edges) 105 of the semiconductor body 100 (edge region). The outer edges 105 extend in the vertical direction y between the first surface 101 and the second surface 102 and are essentially perpendicular to the first surface 101 and the second surface 102. A semiconductor body 100 having a rectangular or square cross section, for example, generally comprises four outer edges 105. According to one example, the active region 220 is horizontally surrounded by the edge region 210. The edge region 210 generally does not comprise any working transistor cells 30. In particular, an edge region 210 may be a region that does not include all active components that are necessary to form a functioning (working) transistor cell 30. Active components are, e.g., gate oxide, source regions 31, body regions 32, gate electrodes 33, or drain regions 36. For example, the edge region 210 may be a region within the semiconductor body 100 which does not comprise any source regions 31.

The source electrode 41 may be arranged at least on the active region 220 of the semiconductor body 100, and may further extend to the edge region 210 of the semiconductor body 100. A field plate electrode, such as the first field plate electrode 45, for example, may be arranged on the second surface 102 in the edge region 210 of the semiconductor body 100. A dielectric insulating layer 52 may be arranged between the first field plate electrode 45 and the second surface 102. According to one example, the first field plate electrode 45 is a floating field plate electrode that is not coupled electrically to any of the elements of the transistor device. Generally speaking, conductive field plates 45 may be used on the edge region 210 of the semiconductor body 100 in order to spread the electric field more uniformly in the edge region 210. According to another example, the first field plate electrode 45 may be electrically connected to the gate pad such that it can assume the potential of the gate pad. A second field plate electrode 44 may be electrically coupled to the drain electrode 43, for example, as is schematically illustrated in FIGS. 1 and 2. The second field plate electrode 44 may be spaced apart from the first field plate electrode 45. That is, the first field plate electrode 45 and the second field plate electrode 44 are not directly connected to each other but are spaced apart with a gap formed between the first field plate electrode 45 and the second field plate electrode 44. A dielectric insulation layer 52 may be arranged at least between a first section of the second field plate electrode 44 and the second surface 102. It is, however, also possible to use floating field plates that are not electrically connected to any elements of the semiconductor device.

The edge region 210 may comprise a horizontal field-stop-region 39 of the same doping type as the body regions 32. The horizontal field-stop-region 39 terminates the drift region 35 horizontally towards the outer edge 105. That is, the horizontal field-stop-region 39 extends horizontally from the outer edge 105 into the semiconductor body 100. According to one example, the horizontal field-stop-region 39 may not comprise any vertical compensation regions 38. According to another example (not illustrated), an intrinsic region may be arranged between the horizontal field-stop-region 39 and the active region 220. One of the body regions 32 (e.g., the outermost body region 32 towards the outer edge 105 in the horizontal direction x) may extend from the active region 220 through the edge region 210 to the outer edge 105. The horizontal field-stop-region 39 may extend from this outermost body region 32 into the semiconductor body 100 in the vertical direction y.

The horizontal field-stop-region 39 may comprise a first section 391, a second section 392, and a third section 393. The first section 391 may be arranged adjacent to the drift region 35 in the horizontal direction x. That is, between the drift region 35 and the outer edge 105. The second section 392 may be arranged adjacent to the vertical field-stop-region 111. That is, between the vertical field-stop-region 111 and the outer edge. The second section 392 may be arranged between the first section 391 and the third section 393 in the vertical direction y. The second section 392 may be of the first doping type and may have a doping concentration that equals the doping concentration of the first section 391. According to another example, the second section 392 may be more highly doped than the first section 391. The third section 393 is arranged between the second section 392 and the second surface 102 in the vertical direction y. In the horizontal direction x, the third section 393 is arranged between the drain region 36 and the outer edge 105. The third section 393 may be more highly doped than the first section 391 and the second section 392. According to one example, a junction termination extension region 70 is arranged between the drain region 36 and the third section 393 in the horizontal direction x. In the vertical direction y, such junction termination extension region 70 may be arranged between the second surface 102 and the vertical field-stop-region 111. The junction termination extension region 70 may be an intrinsic semiconductor region, for example. According to another example, the junction termination extension region 70 may include either an n-type junction termination section having a comparably low doping concentration adjacent to the drain region 36, a p-type junction termination extension region having a comparably low doping concentration adjacent to the third section 393, or both (not specifically illustrated in FIGS. 1 and 2). The junction termination extension region 70 is configured to prevent a direct contact between the comparably highly doped drain region 36 and the comparably highly doped third section 393. The drain region 36 and the third section 393 adjoining each other might result in an unintentionally low voltage breakdown in exactly this transition zone between the drain region 36 and the third section 393. This may be prevented by the junction termination extension region 70.

In the off-state, the semiconductor device is required to block a reverse voltage in the vertical direction y of the semiconductor body 100. This requires device regions, over which this reverse voltage drops horizontally. The vertical field-stop-region 111 generally is a medium doped horizontal layer over which this reverse voltage drops horizontally. However, a resistance of the vertical field-stop-region 111 may not be low enough in order to be able to block the entire reverse voltage arising in the off-state of the transistor device.

Therefore, the semiconductor device further comprises a horizontal compensation region 80. The horizontal compensation region 80 extends from the horizontal field-stop-region 39 into the vertical field-stop-region 111. In particular, the horizontal compensation region 80 extends from the second section 392 into the vertical field-stop-region 111. The horizontal compensation region 80 is of the same doping type as the horizontal field-stop-region 39 and, therefore, of a doping type that is opposite to the doping type of the vertical field-stop-region 111. A dopant dose of the horizontal compensation region 80 may be chosen from a range of ±30% of a dopant dose of the vertical field-stop-region 111. That is, a dopant dose of the horizontal compensation region 80 equals the dopant dose of the vertical field-stop-region 111 or is, at least, similar to the dopant dose of the vertical field-stop-region 111 (±30%). In this way, the charge carriers of the horizontal compensation region 80 may compensate the charge carriers of the vertical field-stop-region 111 at least to a very large extend.

As can be seen in the examples illustrated in FIGS. 1 and 2, the horizontal compensation region 80 does not extend through the entire width of the vertical field-stop-region 111 in the horizontal direction x. That is, the vertical field-stop-region 111 may comprise a first section 111A and a second section 111B. The first section 111A of the vertical field-stop-region 111 and the second section 111B of the vertical field-stop-region 111 may be arranged adjacent to each other in the horizontal direction, wherein the second section 111B of the vertical field-stop-region 111 is arranged between the first section 111A of the vertical field-stop-region 111 and the horizontal field-stop-region 39. The horizontal compensation region 80 may only be arranged in the second section 111B of the vertical field-stop-region 111, but not in the first section 111A of the vertical field-stop-region 111. The horizontal compensation region 80 is configured to compensate the charge carriers of the second section 111B of the vertical field-stop-region 111.

A thickness of the horizontal compensation region 80 in the vertical direction y may be less than a thickness of the vertical field-stop-region 111 in the vertical direction y. As is illustrated in FIGS. 1 and 2, the horizontal compensation region 80 may be arranged such that a layer of the vertical field-stop-region 111 is arranged between the horizontal compensation region 80 and the drain region 36 or, optionally, the junction termination extension region 70, and another layer of the vertical field-stop-region 111 is arranged between the horizontal compensation region 80 and the drift region 35. The horizontal compensation region 80 may be configured to compensate the charge carriers in the layers of the vertical field-stop-region 111 that are arranged above and below the horizontal compensation region 80 in the vertical direction y. In this way, the second section 111B of the vertical field-stop-region 111 may be a quasi-intrinsic region between the first section 111A of the vertical field-stop-region 111 and the horizontal field-stop-region 39. The electrical resistance of the vertical field-stop-region 111 in this way is significantly increased at least in its second section 111B. The resistance of the second section 111B of the vertical field-stop-region 111 may correspond to the resistance of an undoped semiconductor region, for example.

Generally, the electrical resistance of the first section 111A of the vertical field-stop-region 111 could also be reduced by further extending the horizontal compensation region 80 into the first section 111A. However, this may be electrically disadvantageous for some semiconductor devices. If the horizontal compensation region 80 is arranged only in the second section 111B of the vertical field-stop-region 111, the charge carriers of the horizontal compensation region 80 constitute a counter doping to the charge carriers of the second section 111B of the vertical field-stop-region 111 and act as a lateral superjunction which depletes the vertical field-stop-region 111 at very low reverse voltages, thus allowing to block the full off-state reverse voltage of the semiconductor device.

As has exemplarily been described by means of FIGS. 1 and 2 above, a horizontal compensation region 80 may be comprised in a MOSFET device, e.g., a superjunction MOSFET. This, however, is only one specific example of how the invention may be implemented. Generally, a horizontal field-stop-region 80 according to the present invention may also be used in any other kind of semiconductor device comprising a semiconductor region of a first doping type and a semiconductor region of a second doping type, where it is required or advantageous that the semiconductor region of the first doping type and the semiconductor region of the second doping type do not directly adjoin each other. For example, a horizontal field-stop-region 80 may also be used in a Power MOSFET device. A power MOSFET device may have a similar structure as has been described with respect to FIGS. 1 and 2 above, however, the vertical compensation regions 38 may be omitted.

Figure 3:
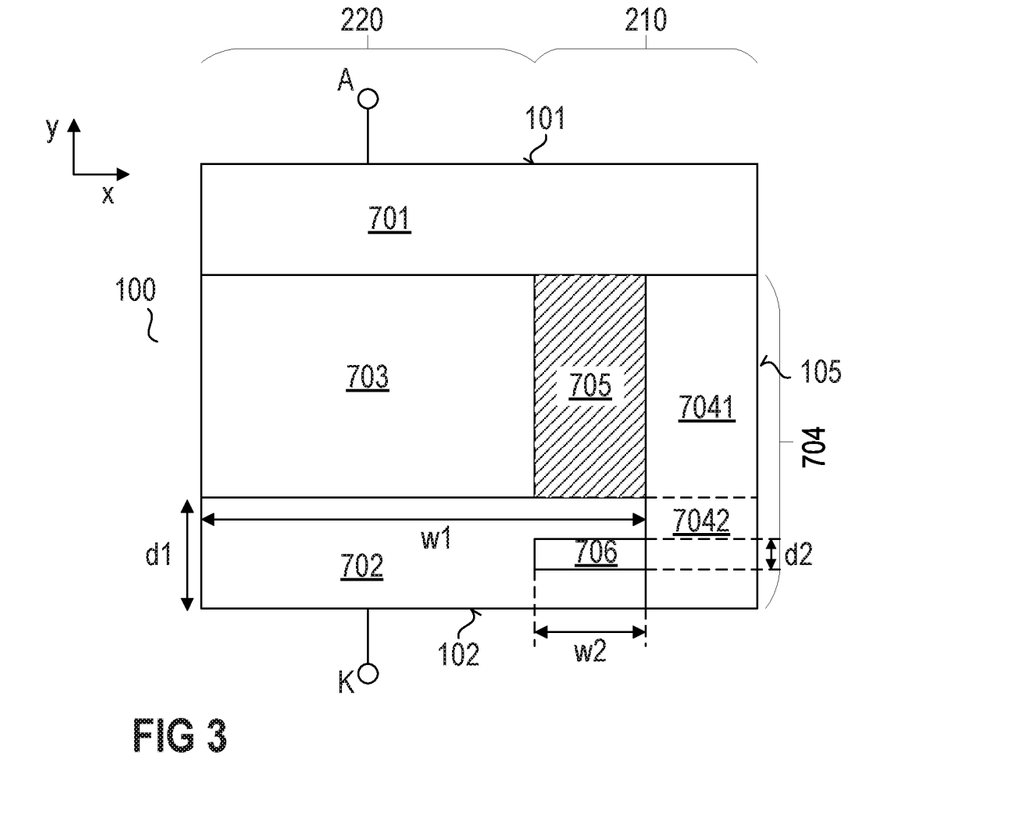
FIG. 3 schematically illustrates a cross sectional view of another semiconductor device.

Another exemplary semiconductor device is illustrated in FIG. 3. Referring to FIG. 3, a cross-sectional view of a semiconductor device comprising a semiconductor body 100 is schematically illustrated. The semiconductor body 100 may include a conventional semiconductor material such as, for example, silicon (Si), silicon carbide (SiC), gallium nitride (GaN), gallium arsenide (GaAs), or the like. A diode arrangement is formed in the semiconductor body 100. The diode arrangement comprises a first semiconductor region 701 of a first doping type that is electrically coupled to a first terminal A. The first terminal A may form an anode of the semiconductor device, for example. The diode arrangement further comprises a second semiconductor region 702 of a second doping type that is electrically coupled to a second terminal (K). The second terminal K may form a cathode of the semiconductor device, for example. The semiconductor device further comprises a third semiconductor region 703 of the second doping type but less highly doped than the second semiconductor region 702. The third semiconductor region 703 extends in an active region 220 of the semiconductor device from the first semiconductor region 701 to the second semiconductor region 702 in the vertical direction y. A horizontal field-stop-region 704 of the first doping type extends in an edge region 210 of the semiconductor device from the first semiconductor region 701 into the semiconductor body 100 in the vertical direction y such that it directly adjoins the first semiconductor region 701 and the second semiconductor region 702. The horizontal field-stop-region 704 may extend between the first semiconductor region 701 and a second surface 102 of the semiconductor body 100, the second surface 102 being arranged opposite to a first surface 101 in the vertical direction y. The horizontal field-stop-region 704, therefore, in the horizontal direction x is arranged between the second semiconductor region 702 and an outer edge 105 of the semiconductor body 100.

As has been described with respect to FIGS. 1 and 2 above, a horizontal compensation region 706 may extend from the horizontal field-stop-region 704 into the second semiconductor region 702. As has been described with respect to the first and second section 111A, 111B of the vertical field-stop-region 111 above, the horizontal compensation region 706 may only be arranged in one section of the second semiconductor region 702. In other words, the second semiconductor region 706 may have a first width w1 in the horizontal direction x. The horizontal compensation region 706 may have a second width w2 in the horizontal direction x. The second width w2 may be smaller than the first width w1. Further, the second semiconductor region 702 may have a first thickness d1 in the vertical direction y, and the horizontal compensation region 706 may have a second thickness d2 in the vertical direction y. The second thickness d2 may be less than the first thickness d1. As has been described before, a layer of the second semiconductor region 702 may be arranged between the horizontal compensation region 706 and the second surface 102, and another layer of the second semiconductor region 702 may be arranged between the horizontal compensation region 706 and the third semiconductor region 703 in the vertical direction y. That is, the horizontal compensation region 706 may be surrounded by the second semiconductor region 702 towards the first surface 101 as well as towards the second surface 102.

According to one example, the semiconductor device may comprise an optional intrinsic semiconductor region 705 arranged between the first semiconductor region 701 and the second semiconductor region 702 in the vertical direction y. In the horizontal direction x, the optional intrinsic semiconductor region 705 may be arranged between the third semiconductor region 703 and the horizontal field-stop-region 704.

The effect of the horizontal compensation region 706 is the same as has been described with respect to the horizontal compensation region 80 in FIGS. 1 and 2 above. The horizontal compensation region 706 is able to relieve a tension that results from the second semiconductor region 702 and the horizontal field-stop-region 704 being connected to different electrical potentials.

Figure 4A:
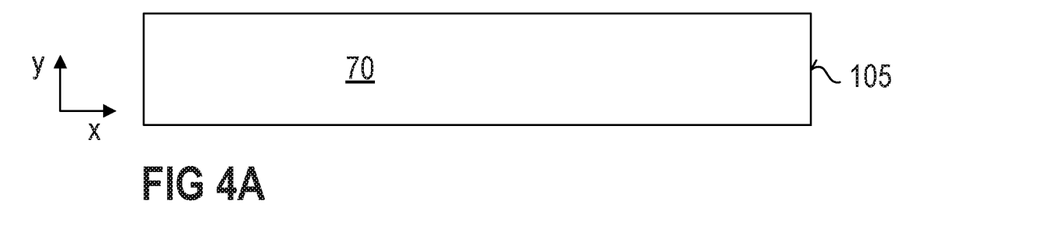
FIGS. 4A to 4D schematically illustrate a method for producing a semiconductor device.

Now referring to FIGS. 4A-4D, a method for producing a semiconductor device is exemplarily illustrated. Referring to FIG. 4A, a first layer of semiconductor material 70 may be formed. The first layer of semiconductor material 70 may be a layer of a second doping type or an intrinsic or undoped layer. Now referring to FIG. 4B, a second semiconductor region 702 may be formed in the first layer of semiconductor material 70 by implanting ions of a second doping type (if the first layer of semiconductor material 70 is an intrinsic or undoped layer). A second section 7042 of a horizontal field-stop-region 704 may be formed in the first layer of semiconductor material 70 by implanting ions of a first doping type. The second section 7042 of the horizontal field-stop-region 704 may be formed adjacent to the second semiconductor region 702 in the horizontal direction x, between the second semiconductor region 702 and an outer edge 105 of the first layer of semiconductor material 70. Further, a horizontal compensation region 706 may be formed in the second semiconductor region 702 by implanting ions of the first doping type. The horizontal compensation region 706 extends from the second section 7042 of the horizontal field-stop-region 704 into the second semiconductor region 702. Forming the horizontal compensation region 706 may comprise one or more than one implanting step, for example. For example, five implanting steps may be performed in order to form the horizontal compensation region 706.

Figure 4B:
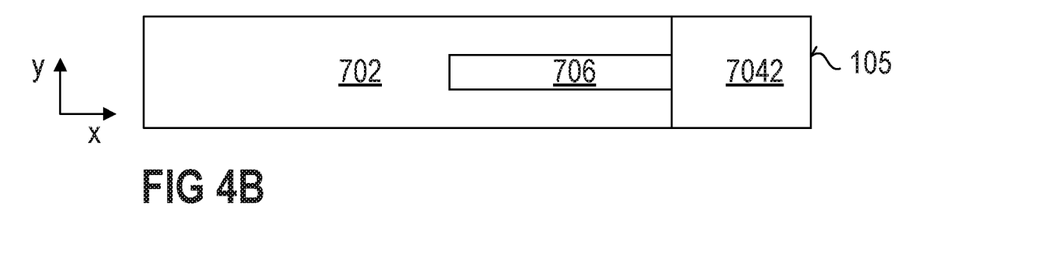
Figure 4C:
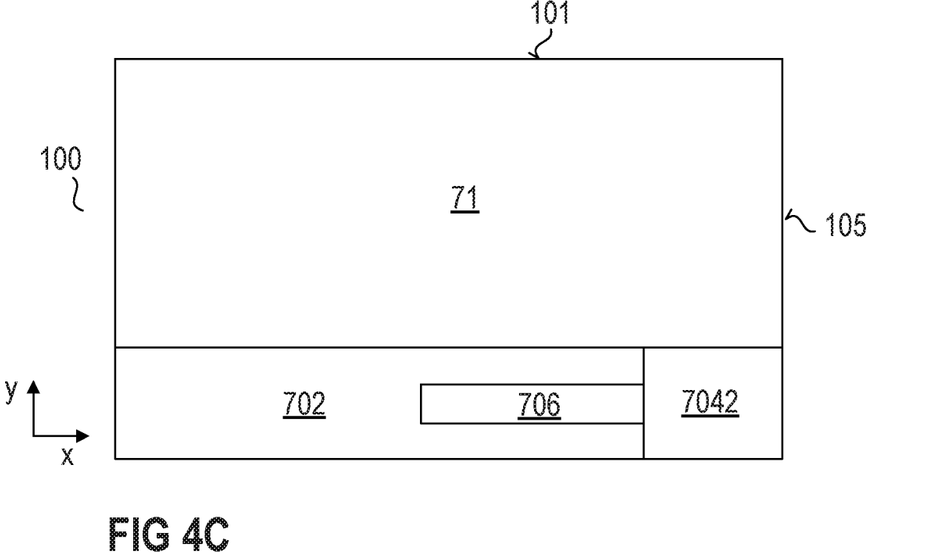
Figure 4D:
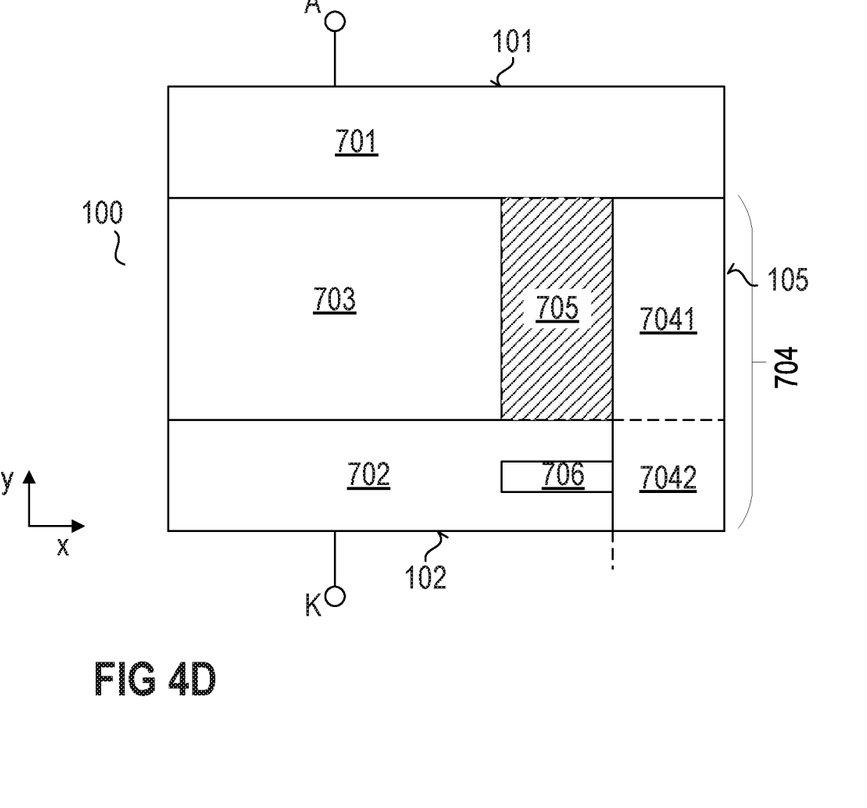

Now referring to FIG. 4C, a second layer of semiconductor material 71 may be deposited on the first layer of semiconductor material 70. The second layer of semiconductor material 71 may be a layer of the second doping type or an intrinsic or undoped layer. The second layer of semiconductor material 71 adjoins the second semiconductor region 702 and the second section 7042 of the horizontal field-stop-region 704 in the vertical direction y. After depositing the second layer of semiconductor material 71, a third semiconductor region 703, a first section 7041 of the horizontal field-stop-region 704 and a first semiconductor region 701 may be formed in the second layer of semiconductor material 71, as is schematically illustrated in FIG. 4D. The third semiconductor region 703 may be formed adjacent to the second semiconductor region 702 in the vertical direction y by implanting ions of the second doping type. The first section 7041 of the horizontal field-stop-region 704 may be formed adjacent to the second section 7042 of the horizontal field-stop-region 704 in the vertical direction y by implanting ions of the first doping type. The first section 7041 extends from the outer edge 105 of the semiconductor body 100 formed by the first layer of semiconductor material 70 and the second layer of semiconductor material 71 into the semiconductor body 100 in the horizontal direction x. Optionally, an intrinsic semiconductor region 705 may remain between the horizontal field-stop-region 704 and the third semiconductor region 703.

The first semiconductor region 701 may be formed between the third semiconductor region 703, the horizontal field-stop-region 704 and the optional intrinsic semiconductor region 705 and a first surface 101 of the semiconductor body 100 by implanting ions of the first doping type.

By means of the method described with respect to FIGS. 4A-4D, a semiconductor device similar to the device that has been described with respect to FIG. 3 may be formed, e.g., a diode. However, it is also possible that in further steps (not specifically illustrated) the elements of a transistor device are formed, e.g., in the first and the third semiconductor regions 701, 703.

Figure 5A:
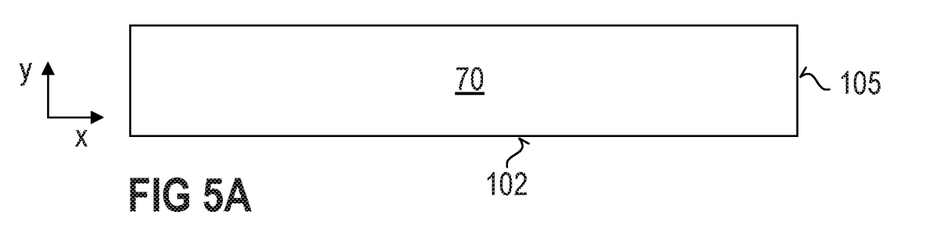
FIGS. 5A to 5D schematically illustrate another method for producing a semiconductor device.

Another method will be described with respect to FIGS. 5A-5D in the following. Referring to FIG. 5A, a first layer of semiconductor material 70 may be provided. Now referring to FIG. 5B, a second semiconductor region 111 (vertical field-stop-region) may be formed in the first layer of semiconductor material 70 by implanting ions of a second doping type. A second section 392 of a horizontal field-stop-region 39 may be formed in the first layer of semiconductor material 70 by implanting ions of a first doping type. The second section 392 of the horizontal field-stop-region 39 may be formed adjacent to the second semiconductor region 111 in the horizontal direction x, between the second semiconductor region 111 and an outer edge 105 of the first layer of semiconductor material 70. Further, a horizontal compensation region 80 may be formed in the second semiconductor region 111 by implanting ions of the first doping type. The horizontal compensation region 111 extends from the second section 392 of the horizontal field-stop-region 39 into the second semiconductor region 111. Forming the horizontal compensation region 80 may comprise one or more than one implanting step, for example. For example, five implanting steps may be performed in order to form the horizontal compensation region 80.

Figure 5B:
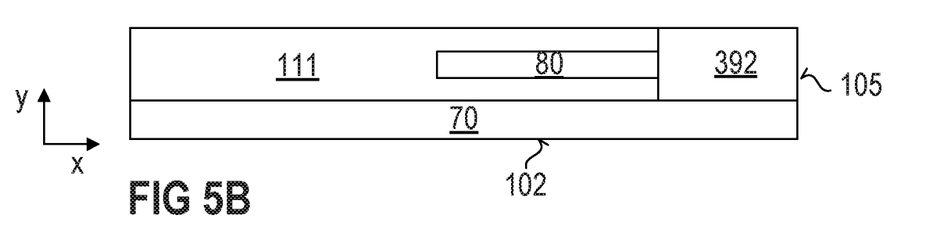
Figure 5C:
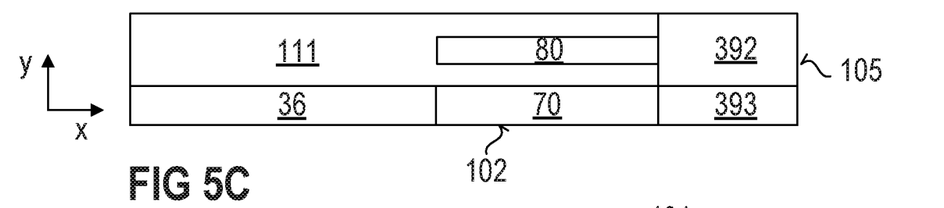

In contrast to the example illustrated in FIG. 4B, a section of the first layer of semiconductor material 70 remains in the example of FIG. 5B. This section of semiconductor material 70 may be arranged adjacent to the second surface 102 of the semiconductor body 100. However, in another step, as is schematically illustrated in FIG. 5C, a drain region 36 may be formed in the remaining section of the first layer of semiconductor material 70 by implanting ions of the second doping type. The drain region 36 may be more highly doped than the second semiconductor region 111. Further, a third section 393 of the horizontal field-stop-region 39 may be formed in the remaining section of the layer of semiconductor material 70 by implanting ions of the first doping type. The third region 393 may be more highly doped than the second region 392.

The drain region 36 may be arranged between the second surface 102 and the second semiconductor region 111, and the third section 393 may be arranged between the second section 392 of the horizontal field-stop-region 39 and the second surface 102. A small section of the first layer of semiconductor material 70 still may remain between the drain region 36 and the third section 393 of the horizontal field-stop-region 39, forming an intrinsic region between the drain region 36 and the third section 393 of the horizontal field-stop-region 39.

Figure 5D:
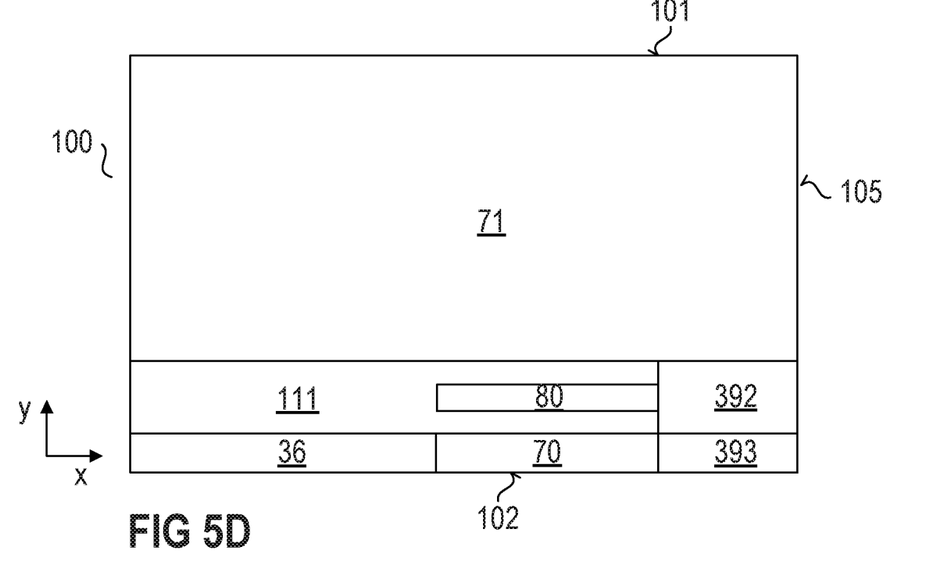

Now referring to FIG. 5D, a second layer of semiconductor material 71 may be deposited on the first layer of semiconductor material 70. The second layer of semiconductor material 71 adjoins the second semiconductor region 702 and the second section 392 of the horizontal field-stop-region 39 in the vertical direction y.

After depositing the second layer of semiconductor material 71, a third semiconductor region (e.g., drift region 35), a first section 391 of the horizontal field-stop-region 39 and a first semiconductor region (e.g., body region 32) may be formed in the second layer of semiconductor material 71. This further step is not specifically illustrated in the Figures but is similar to what has been described with respect to FIG. 4D above. Even further, further elements of a transistor device such as, e.g., vertical compensation regions 38, source regions 31 and gate electrodes 33 may be formed using conventional methods in order to form a transistor device in the semiconductor body 100. For example, a transistor device according to the examples illustrated in FIGS. 1 and 2 may be formed using conventional methods.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor body comprising a first surface and a second surface opposite to the first surface in a vertical direction;
   a first semiconductor region of a first doping type and electrically coupled to a first terminal;
   a second semiconductor region of a second doping type and electrically coupled to a second terminal;
   a third semiconductor region of the second doping type, but less highly doped than the second semiconductor region, extending in an active region of the semiconductor device from the first semiconductor region to the second semiconductor region in the vertical direction;
   a horizontal field-stop-region of the first doping type and extending in an edge region of the semiconductor device from the first semiconductor region into the semiconductor body in the vertical direction, such that the horizontal field-stop-region directly adjoins the first semiconductor region and the second semiconductor region; and
   a horizontal compensation region of the first doping type and extending from the horizontal field-stop-region into the second semiconductor region in a horizontal direction which is perpendicular to the vertical direction.

2. The semiconductor device of claim 1, wherein the horizontal field-stop-region surrounds the second semiconductor region and the third semiconductor region in a horizontal plane.

3. The semiconductor device of claim 1, wherein the second semiconductor region has a first width in the horizontal direction, wherein the horizontal compensation region has a second width in the horizontal direction, and wherein the second width is smaller than the first width.

4. The semiconductor device of claim 1, wherein the second semiconductor region has a first thickness in the vertical direction, wherein the horizontal compensation region has a second thickness in the vertical direction, and wherein the second thickness is smaller than the first thickness.

5. The semiconductor device of claim 1, wherein a dopant dose of the horizontal compensation region is chosen from a range of ±30% of a dopant dose of the second semiconductor region.

6. The semiconductor device of claim 1, wherein the horizontal field-stop-region comprises a first section and a second section, and wherein the second section is arranged adjacent to the horizontal compensation region.

7. The semiconductor device of claim 1, wherein the second semiconductor region is a vertical field-stop-region, and wherein the semiconductor device further comprises a drain region arranged adjacent to the second semiconductor region in the vertical direction.

8. The semiconductor device of claim 7, further comprising a plurality of transistor cells at least partly integrated in the active region, each transistor cell comprising a source region, a body region formed by a section of the first semiconductor region, a drift region formed by a section of the third semiconductor region and separated from the source region by the body region, and a gate electrode dielectrically insulated from the body region.

9. The semiconductor device of claim 8, further comprising vertical compensation regions extending from the body regions towards the second semiconductor region.

10. The semiconductor device of claim 8, further comprising a source electrode arranged above the first surface and electrically connected to the source regions of the plurality of transistor cells.

11. The semiconductor device of claim 8, further comprising:
    a drain electrode electrically connected to the drain region; and
    a gate pad electrically connected to the gate electrodes of the plurality of transistor cells,
    wherein the drain electrode and the gate pad are arranged above the second surface.

12. The semiconductor device of claim 1, further comprising an intrinsic semiconductor region arranged between the first semiconductor region and the second semiconductor region in the vertical direction, and arranged between the third semiconductor region and the horizontal field-stop-region in the horizontal direction.

13. A method, comprising:
    forming a second semiconductor region in a first layer of semiconductor material, by implanting ions of a second doping type;
    forming a second section of a horizontal field-stop-region in the first layer of semiconductor material, by implanting ions of a first doping type, wherein the second section of the horizontal field-stop-region adjoins the second semiconductor region in a horizontal direction;
    forming a horizontal compensation region in the second semiconductor region, by implanting ions of the first doping type, wherein the horizontal compensation region extends from the second section of the horizontal field-stop-region into the second semiconductor region in the horizontal direction;
    depositing a second layer of semiconductor material on the first layer of semiconductor material;
    forming a third semiconductor region of the second doping type in the second layer of semiconductor material;

forming a first semiconductor region of the first doping type in the second layer of semiconductor material, wherein the third semiconductor region is arranged between the first semiconductor region and the second semiconductor region in a vertical direction that is perpendicular to the horizontal direction; and forming a first section of the horizontal field-stop-region of the first doping type, wherein the first section extends from the first semiconductor region to the second section in the vertical direction.

14. The method of claim 13, wherein the first layer of semiconductor material is either a junction termination extension region of at least one of the first doping type and the second doping type, or is an intrinsic or undoped layer.

15. The method of claim 13, further comprising:

forming a plurality of transistor cells, each transistor cell comprising a source region, a body region formed by a section of the first semiconductor region, a drift region formed by a section of the third semiconductor region and separated from the source region by the body region, and a gate electrode dielectrically insulated from the body region.

16. The method of claim 15, further comprising:

forming vertical compensation regions extending from the body regions towards the second semiconductor region.

17. The method of claim 15, further comprising:

forming a source electrode electrically connected to the source regions of the plurality of transistor cells.

18. The method of claim 15, further comprising:

forming a drain electrode electrically connected to the drain region; and forming a gate pad electrically connected to the gate electrodes of the plurality of transistor cells.

19. The method of claim 13, further comprising:

forming an intrinsic semiconductor region arranged between the first semiconductor region and the second semiconductor region in the vertical direction, and arranged between the third semiconductor region and the horizontal field-stop-region in the horizontal direction.

* * * * *